United States Patent [19]
Venkatraman et al.

[11] Patent Number: 6,069,522
[45] Date of Patent: May 30, 2000

[54] CIRCUITRY AND METHOD FOR PROVIDING BOOST AND ASYMMETRY IN A CONTINUOUS-TIME FILTER

[75] Inventors: Srinivasan Venkatraman, Bangalore, India; Richard C. Pierson, Dallas, Tex.

[73] Assignee: Texas Instruments Incorporated, Dallas, Tex.

[21] Appl. No.: 09/016,907

[22] Filed: Feb. 2, 1998

Related U.S. Application Data

[60] Provisional application No. 60/037,125, Feb. 3, 1997.

[51] Int. Cl.$^7$ ........................................................ H03K 5/00
[52] U.S. Cl. ............................. 327/552; 327/52; 327/65; 327/103
[58] Field of Search ................................. 327/50, 51, 52, 327/103, 552, 478, 363, 65

[56] References Cited

U.S. PATENT DOCUMENTS

| | | | |
|---|---|---|---|
| 5,483,183 | 1/1996 | Li et al. ..................................... | 327/52 |
| 5,489,872 | 2/1996 | Gopinathan ............................. | 327/552 |

OTHER PUBLICATIONS

"Monolithic 10–30 MHz Tunable Bipolar Bessel Lowpass Filter", De Veirman, et al., Paper 7–D.2, IEEE Proc. ISCAS, pp. 1444–1447, 1991, pp. 521–524.

"A 20–MHz Sixth–Order BiCMOS Parasitic–Insensitive Continuous–Time Filter and Second–Order Equalizer Optimized for Disk–Drive Read Channels", Labor, et al., IEEE Journal of Solid–State Circuits, vol. 28, No. 4, Apr. 1993, pp. 462–470.

*Primary Examiner*—Dinh T. Le
*Attorney, Agent, or Firm*—W. Daniel Swayze, Jr.; W. James Brady, III; Frederick J. Telecky, Jr.

[57] ABSTRACT

A capacitor current sensing circuitry (100) for sensing the current through a bandpass capacitor (20) of a first biquad stage (80) and generating an output current in response. The capacitor current sensing circuitry (100) includes a differential input circuit comprising a transistor (123) and a transistor (124), a fixed current source (130), a variable current source (120), a variable current, source (122), an input current sink (126), a differential output circuit comprising a transistor (132) and a transistor (134), and a programmable output current sink (138). The differential input circuit receives an input sense voltage and generates a first input current, a second input current, a first output voltage, and a second output voltage in response. The fixed current source (130) generates a current that is used to provide a first current component to the first input current and a first current component to the second input current. The variable current source (120) and the variable current source (122) generate a second component of the first input current and the second input current, respectively. The input current sink (126) receives the first input current and the second input current. The transistor (132) receives the first output voltage and generates a first output current in response, while the transistor (134) receives the second output voltage and generates a second output current in response. The programmable output current sink (138) receives the first output current and the second output current.

11 Claims, 2 Drawing Sheets

CIRCUITRY AND METHOD FOR PROVIDING BOOST AND ASYMMETRY IN A CONTINUOUS-TIME FILTER

RELATED APPLICATIONS

This application is related to the following co-pending U.S. Provisional applications: Ser. No. 09/016,896 entitled CIRCUITRY AND METHOD FOR PROVIDING A DIFFERENTIATED OUTPUT FROM A STAGE OF A CONTINUOUS-TIME FILTER, (TI Docket No. TI-20840), filed concurrently on Feb. 3, 1997.

TECHNICAL FIELD OF THE INVENTION

This invention relates generally to the field of electronic circuitry and more particularly to a circuitry and method for providing boost and asymmetry in a continuous-time filter.

This amendment claims priority under 35 USA § 119(e) (1) of provisional application No. 60/037,125 filed Feb. 2, 1997

BACKGROUND OF THE INVENTION

Filters used in high-frequency applications, such as disk drive, video, and data transmission applications are generally implemented as continuous-time active filters. These continuous-time active filters are often implemented using transconductance-capacitor ("$g_m$-C") filters. Continuous-time active filters of a desired order may be constructed by serially coupling or connecting $g_m$-C filter stages until a filter having the desired order and response is provided. For example, continuous-time active filters configured as biquadratic filters may be provided using $g_m$-C filter stages. A biquadratic filter is one whose transfer function contains complete quadratic equations in both the numerator and the denominator and can be implemented, for example, as a low pass filter, a high pass filter, or a notch filter.

In many applications, such as in data transmission and disk drive applications, it is advantageous to provide a continuous-time active filter with a constant group delay characteristic over a desired range of frequencies to prevent distortion of a signal waveform. The group delay may be defined as the negative of the derivative of the phase with respect to frequency. Furthermore, it is often advantageous and desirable to provide an adjustable or selectable group delay that provides a constant group delay at the selected group delay. It is also often advantageous and desirable to provide amplification of selected frequency components or frequency spectrums. The amplification of selected frequency components or frequency spectrums may be referred to as "boost."

For illustration purposes, the standard second order low pass filter transfer function is provided below:

$$H(s) = \frac{\omega_o^2}{s^2 + s\frac{\omega_o}{Q} + \omega_o^2}$$

In order to provide an adjustable group delay that will be constant throughout the frequency spectrum, and boost, the standard second order low pass transfer function may be converted into the following equation:

$$H(s) = \frac{-ks^2 + bs + \omega_o^2}{s^2 + s\frac{\omega_o}{Q} + \omega_o^2}$$

where the term "$-ks^2$" is a boost term, and the term "$bs$" is an asymmetric zero term which is used to provide the adjustable group delay that is constant throughout the frequency spectrum. The boost term, $-ks^2$, increases high frequency gain by adding two real symmetric zeros to the transfer function. Since one of the zeros is positive and the other is negative, the phase is not changed. The amplitude of the boost may be programmable and may be adjusted according to the value of "k." The asymmetric zero term, bs, causes the real zeros to no longer be symmetric which results in a change in the phase and hence the group delay of the transfer function. In order to provide asymmetry, b may be provided as either a positive value or a negative value, but not at a zero value. Thus, the group delay may be adjusted by changing the "b" term of the asymmetric zero term.

In disk drive applications, the boost may be used for such applications as pulse slimming and/or read channel equalization. The asymmetric zeros or adjustable group delay may be used in such applications to adjust the group delay characteristics of the disk drive read channel or data channel to optimize performance.

Prior attempts at providing boost and adjustable group delay have proven unsatisfactory at best. For example, one prior attempt at providing boost and adjustable group delay involved the use of an amplifier for amplifying an input signal to a $g_m$-C filter stage and driving the bottom plate or electrode of the output capacitor of the $g_m$-C filter stage. This presented serious technical problems due to the existence of a parasitic capacitor whose bottom plate could not be driven by the amplifier. In some cases, the value of the parasitic capacitor was up to thirty percent of the value of the output capacitor of the $g_m$-C filter stage. As a result, the effective boost term, $ks^2$, was greatly reduced. Because the boost term was significantly reduced, an amplifier having a very high gain had to be provided to overcome this limitation. The high gain amplifier significantly increased overall power consumption. Also, the value of the parasitic capacitance was difficult, if not impossible, to predict because of semiconductor fabrication variations. This required the use of an amplifier with adjustable gain which further increased circuitry and costs. Furthermore, the amplifier generally had a limited bandwidth which reduced its effectiveness for applications using high frequency signals.

Another prior attempt at providing boost involved amplifying a current provided through the capacitor of a $g_m$-C filter stage of a continuous-time filter. This technique has also proven unsatisfactory. The current provided through the capacitor is often large and consumes a significant amount of power when amplified. The increased power consumption results in increased circuitry area to handle the increased power consumption. The increased circuitry area increases undesirable circuitry parasitics.

SUMMARY OF THE INVENTION

From the foregoing it may be appreciated that a need has arisen for a circuitry and method for providing boost and asymmetry in a continuous-time filter that eliminate or reduce the problems described above. In accordance with the present invention, a circuitry and method for providing boost and asymmetry in a continuous-time filter are provided which substantially eliminate the disadvantages and problems outlined above by providing a low power solution with the capability of providing programmable boost and programmable group delay that is independent of the bandwidth or the cut-off frequency of the filter.

According to the present invention, a capacitor current sensing circuitry is provided for sensing a current through a capacitor of a filter stage and generating an output current in response. The capacitor current sensing circuitry includes a differential input circuit, a current source, a first variable input current source, a second variable input current source, an input current sink, a differential output circuit, and an output current sink. The differential input circuit receives an input sense voltage, that is related to the current flowing though the capacitor, and generates a first input current, a second input current, a first input voltage, and a second input voltage in response. The current source generates a first current component of the first input current and a first current component of the second input current. The first variable input current source and the second variable input current source generate a second current component of the first input current and a second current component of the second input current, respectively. The input current sink receives the first input current and the second input current. The differential output circuit receives the first input voltage and the second input voltage and generates a first output current and a second output current in response. The first output current and the second output current serve as the output current of the capacitor current sensing circuitry. An output current sink receives the first output current and the second output current.

The present invention provides various technical advantages. A technical advantage of the present invention includes reduced power consumption while providing boost and group delay independent of the bandwidth and the cut-off frequency of the filter. Another technical advantage of the present invention includes reduced circuitry area due to the reduced power consumption. The reduced circuitry area results in reduced circuitry parasitics. Still another technical advantage includes the capability to provide a programmable boost and a programmable group delay. Another technical advantage of the present invention includes the elimination of the parasitic capacitance problem encountered when driving the bottom plate of an output capacitor. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
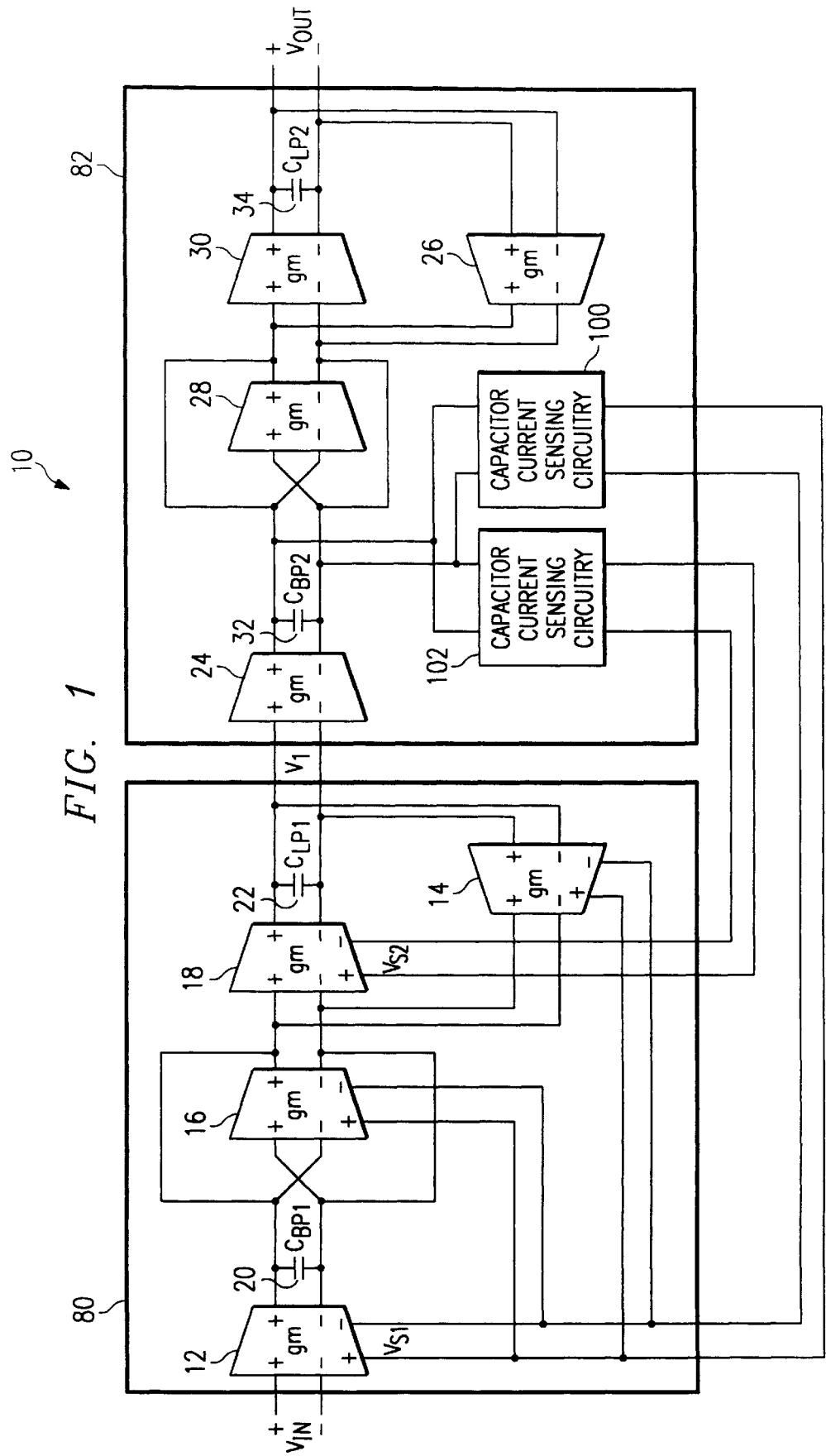
FIG. 1 is a circuit diagram illustrating a continuous-time filter according to the teachings of the present invention.

FIG. 1 is a circuit diagram illustrating a continuous-time filter 10 that includes a first biquad stage 80 and a second biquad stage 82. Continuous-time filter 10 is shown implemented as a continuous-time low pass filter in the one embodiment illustrated in FIG. 1. It should be understood that even though continuous-time filter 10 is shown and will be described as being implemented as a continuous-time low pass filter, the present invention may be implemented using virtually any type of filter such as a notch filter, an all pass filter, or a bandpass filter. Similarly, it should also be understood that although continuous-time filter 10 is illustrated as including two stages, the present invention may be implemented as part of a continuous-time filter that includes two or more stages. First biquad stage 80 and second biquad stage 82 are each second order low pass filters that function as a fourth order, biquadratic low pass filter when coupled as shown in FIG. 1. The equation which defines the operation of continuous-time filter 10 is shown below:

$$V_{OUT}/V_{IN} = \frac{-ks^2(C_{LP1}C_{BP1}/C_{LP2}C_{BP2}) - bs(C_{LP1}g_m/C_{LP2}C_{BP2}) + g_m^2/C_{LP2}C_{BP2}}{s^2 + s(g_m/C_{BP2}) + g_m^2/C_{LP2}C_{BP2}}$$

where $V_{IN}$ is the input voltage provided to first biquad stage 80 and $V_{OUT}$ is the output voltage provided from second biquad stage 82. The term "$-ks^2$" represents the boost term, and the term "bs" represents the asymmetric zero or constant group delay term. The "k" term represents a programmable variable so that the boost can be established as desired. The "b" term represents a programmable variable so that the constant group delay can be established as desired. The various transconductors illustrated in the one embodiment of the present invention shown in FIG. 1 are provided with equivalent transconductance values $g_m$. However, it should be noted that the present invention includes implementations in which the transconductance values are provided at different values.

First biquad stage 80 is implemented using various transconductors and capacitors to serve as a second order, biquadratic, low pass filter. First biquad stage 80 includes a transconductor 12, a bandpass capacitor 20, a transconductor 16, a transconductor 18, a low pass capacitor 22, and a transconductor 14. Transconductor 12 receives input voltage $V_{IN}$ at input terminals and provides a current to bandpass capacitor 20 at output terminals. Bandpass capacitor 20 and transconductor 16, configured as a termination impedance device, couple across the output terminals of transconductor 12. Transconductor 16 also couples across input terminals of transconductor 18 and output terminals of transconductor 14. Low pass capacitor 22 couples across the output terminals of transconductor 18, while input terminals of transconductor 14 also couple across the output terminals of transconductor 18. Transconductor 14 is configured to receive an output voltage at its input terminals from the output terminals of transconductor 18 and to provide an output current to the input terminals of transconductor 18 as shown in FIG. 1. The output terminals of transconductor 18 serve as the output terminals of first biquad stage 80.

Second biquad stage 82 is also implemented using various transconductors and capacitors to serve as a second order, biquadratic, low pass filter. Second biquad stage 82 includes a transconductor 24, a bandpass capacitor 32, a transconductor 28, a transconductor 30, a low pass capacitor 34, and a transconductor 26. A capacitor current sensing circuitry 100 and a capacitor current sensing circuitry 102 are also shown as part of second biquad stage 82 for convenience. Capacitor current sensing circuitry 100 and capacitor current sensing circuitry 102 may be implemented as part of second biquad stage 82 or separately from second biquad stage 82. Transconductor 24 receives an input voltage from first biquad stage 80 at input terminals and provides a current to bandpass capacitor 32 at output terminals. Bandpass capacitor 32 and transconductor 28, configured as a termination impedance device, couple across the output terminals of transconductor 24. Transconductor 28 also couples across input terminals of transconductor 30 and output terminals of transconductor 26. Low pass capacitor 34 couples across the output terminals of transconductor 30, while input terminals of transconductor 26 also couple across the output terminals of transconductor 30. Transconductor 26 is configured to receive an output voltage $V_{OUT}$ at its input terminals from the output terminals of transconductor 30 and to provide an output current to the input terminals of transconductor 30 as illustrated. The output terminals of transconductor 30 serve as the output terminals of continuous-time filter 10 and provide output voltage $V_{OUT}$.

Capacitor current sensing circuitry 100 and capacitor current sensing circuitry 102 may be implemented as part of second biquad stage 82 or separately from second biquad stage 82. Capacitor current sensing circuitry 100 receives a sense voltage that corresponds to the current flowing through bandpass capacitor 20 and generates a corresponding output current that is provided to the output terminals of transconductor 24. The current through bandpass capacitor 20 is related to the second derivative of the input voltage provided from first biquad stage 80 to second biquad stage 82. Hence, the output current provided from capacitor current sensing circuitry 100 corresponds or is proportional to the second derivative of the input voltage provided from first biquad stage 80. As a consequence, the output current of capacitor current sensing circuitry 100 serves as the "$ks^2$" term or boost term of the previous equation. Because the output current of capacitor current sensing circuitry 100 is programmable, capacitor current sensing circuitry 100 provides the "k" term that provides programmable boost.

Similarly, capacitor current sensing circuitry 102 receives a sense voltage that corresponds to the current flowing through low pass capacitor 22 and generates a corresponding output current that is provided to the output terminals of transconductor 24. The current through low pass capacitor 22 is related to the first derivative of the input voltage provided from first biquad stage 80 to second biquad stage 82. Hence, the output current provided from capacitor current sensing circuitry 102 corresponds or is proportional to the first derivative of the input voltage provided from first biquad stage 80. As a consequence, the output current of capacitor current sensing circuitry 102 serves as the "bs" term which is the asymmetric zero or constant group delay term of the previous equation. Because the output current of capacitor current sensing circuitry 102 is programmable, capacitor current sensing circuitry 102 provides the "b" term that is programmable. Thus, a constant group delay can be programmed and provided as desired. Capacitor current sensing circuitry 100 and capacitor current sensing circuitry 102 may be implemented identically or similarly and one embodiment is illustrated more fully in FIG. 2.

All of the transconductors illustrated in FIG. 1 may be implemented using any of a variety of circuitry that may be configured to serve as a transconductor. For example, a transconductor generally will include a differential input transistor pair using either bipolar junction transistors or field-effect transistors. Similarly, a transconductor may also include a current source load using field-effect transistors, biopolar junction transistors, or resistors. It should be understood that the present invention encompasses any implementation of a transconductor and is not limited to any one implementation. It should also be noted that the transconductance of each of the transconductors illustrated in FIG. 1 are provided at the same transconductance. However, it should be understood that in an actual implementation, the transconductance of the transconductors may be provided at the same transconductance at different transconductances.

In operation, transconductor 12 receives an input voltage $V_{IN}$ across its input terminals and generates an output current, as a differential current, at its output terminals. As a result, a current is provided through bandpass capacitor 20 and through transconductor 16, which serves as a termination impedance device. Capacitor current sensing circuitry 100 senses the current through bandpass capacitor 20 and provides a corresponding or proportional current to second biquad stage 82. Transconductor 16 generates an output voltage that is provided to the input terminals of transconductor 18. In response, transconductor 18 generates an output current which results in a current being provided through low pass capacitor 22 and a voltage being generated across its plates or electrodes. Capacitor current sensing circuitry 102 senses the current through low pass capacitor 22 and provides a corresponding or proportional current to second biquad stage 82. Transconductor 14 provides feedback to transconductor 18 by receiving the voltage that is generated across low pass capacitor 22 and providing a current to the input terminals of transconductor 18. The voltage provided across low pass capacitor 22, and hence the output terminals of transconductor 18, serves as the output voltage of first biquad stage 80 and as an input voltage to second biquad stage 82.

Transconductor 24 receives the input voltage from first biquad stage 80 across its input terminals and generates an output current, as a differential current, at its output terminals. As a result, a current is provided through bandpass capacitor 32 and through transconductor 28, which serves as a termination impedance device. Additionally, capacitor current sensing circuitry 100 and capacitor current sensing circuitry 102 provide currents to the output of transconductor 24 that correspond to or are proportional to the capacitor currents flowing through bandpass capacitor 20 and low pass capacitor 22 of first biquad stage 80. These currents provide the programmable boost term and the programmable group delay term. Transconductor 28 generates an output voltage that is provided to the input terminals of transconductor 30. In response, transconductor 30 generates an output current which results in a current being provided through low pass capacitor 34 and a voltage being generated across its plates or electrodes. Transconductor 26 provides feedback to transconductor 30 by receiving the voltage that is generated across low pass capacitor 34 and providing a current to the input terminals of transconductor 30. The voltage provided across low pass capacitor 34, and hence the output terminals of transconductor 30, serves as the output voltage $V_{OUT}$ continuous-time filter 10.

Figure 2:
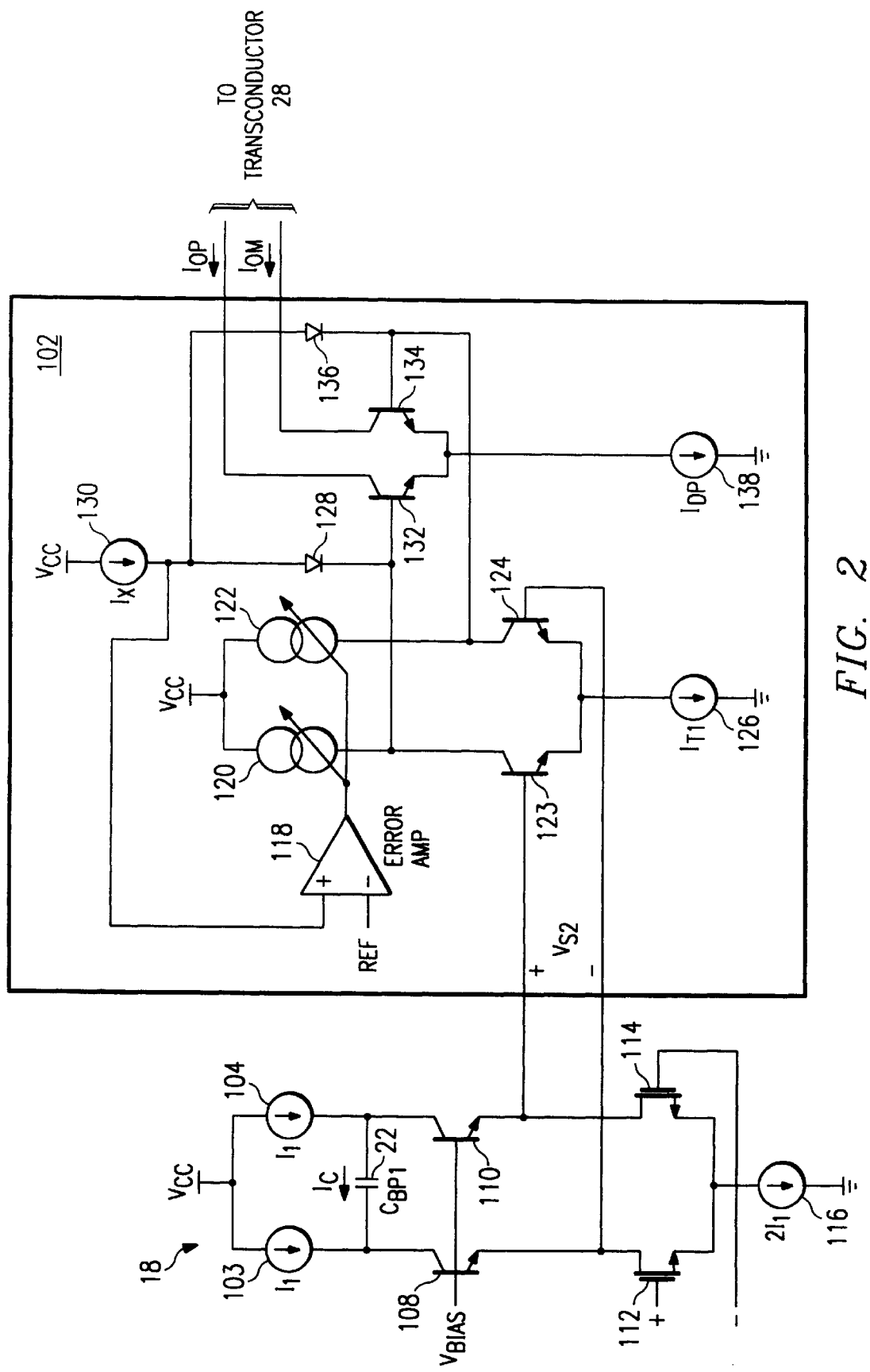
FIG. 2 is a circuit diagram illustrating a capacitor current sensing circuitry of the continuous-time filter.

FIG. 2 is a circuit diagram illustrating capacitor current sensing circuitry 100 of continuous-time filter 10. The equation below illustrates the operation of capacitor current sensing circuitry 100:

$$I_{OP} - I_{OM} = -(I_{T1}/I_1)(1/2I_X)I_{DP}I_C$$

where $I_{OP}$ and $I_{OM}$ comprise an output differential current, $I_{T1}$ is a programmable current source, $I_1$ and $I_X$ are fixed current sources such that the terms $-(I_{T1}/I_1)$ and $(1/2I_X)$ are constants, $I_{DP}$ is a programmable current source, and $I_C$ is the current through bandpass capacitor 20 of first biquad stage 80. Capacitor current sensing circuitry 100 senses the current flowing through bandpass capacitor 20 of first biquad stage 80 and generates an output differential current, $I_{OP}$ and $I_{OM}$, in response. The output differential current is then provided to the output of transconductor 24 and bandpass capacitor 32 of second biquad stage 82 so that programmable boost may be provided to continuous-time filter 10.

In addition to illustrating capacitor current sensing circuitry 100, FIG. 2 also includes an illustration of one embodiment of transconductor 12 of first biquad stage 80. Transconductor 12 receives an input voltage $V_{IN}$ at the gates of a field effect transistor ("FET") 112 and a FET 114 and assists with providing sense voltage $V_S$ to capacitor current sensing circuitry 100 in response. Transconductor 12 further includes a current source 103 and a current source 104 with bandpass capacitor 20 shown coupled between them. Current source 103 and current source 104 provide identical currents $I_1$. A current sink 116, a transistor 108, and a transistor 110 are also provided as part of transconductor 12.

Transconductor 12 receives an input voltage $V_{IN}$ at the gates of FET 112 and FET 114 and provides two currents through the channel of FET 112 and FET 114 in response. Transistor 108 and a transistor 110 are biased using a bias voltage $V_{BIAS}$ provided at their base terminals. Transistor 108 and transistor 110 may be implemented using matching bipolar junction transistors. As a result of providing the bias voltage, the two currents, mentioned above with respect to FET 112 and FET 114, will flow along with two currents through transistor 108 and transistor 110. The value of the currents will be determined by the input voltage $V_{IN}$, that is provided across the gates of FET 112 and FET 114, and the value of bandpass capacitor 20.

The sum of the currents flowing through transistor 108 and transistor 110 should be about equal to $2I_1$. Current source 103 and current source 104 provide a total current that is equal to $2I_1$ and which is distributed through the circuitry of transconductor 12 that is provided between these current sources and current sink 116. Current sink 116 will receive and "sink" a current that is about equal to $2I_1$. Thus, the difference between the currents flowing through transistor 108 and transistor 110 will be equivalent to the current $I_C$ flowing through bandpass capacitor 20 as illustrated in FIG. 2.

FET 112 and FET 114 will generally operate within the saturation region. The input voltage $V_{IN}$ will result in different drain currents being provided through FET 112 and FET 114, similar to the different currents provided through transistor 108 and transistor 110. As a consequence, the emitter voltage of transistor 108 and the emitter voltage of transistor 110 will be different. However, the sum of the two drain currents of FET 112 and FET 114 will still be approximately equivalent to the current $2I_1$. Just as with transistor 108 and transistor 114, whenever the drain current of FET 112 is greater than the drain current of FET 114, the current $I_C$ is provided through bandpass capacitor 20 in the direction as illustrated. Conversely, whenever the drain current provided through FET 114 is greater than the drain current provided through FET 112, the excess current will flow through bandpass capacitor 20 in the opposite direction to provide the additional current.

The voltage provided between the emitter of transistor 108 and the emitter of transistor 110 is defined as the sense voltage $V_S$. The sense voltage $V_S$ is illustrated in FIG. 1 and is shown being applied to the input of capacitor current sensing circuitry 100. As was just described and illustrated, the sense voltage $V_S$ is related to the current flowing through bandpass capacitor 20 which ultimately is related to the second derivative of the output voltage of first biquad stage 80.

Capacitor current sensing circuitry 100 receives sense voltage $V_S$ at a differential input circuit that includes a transistor 123 and a transistor 124 and generates a differential output current at a differential output circuit. The differential output current is provided to the output of transconductor 24, to bandpass capacitor 32, and to transconductor 28 of the second biquad stage 82 as illustrated in FIG. 1. The differential output current includes current $I_{OP}$ and current $I_{OM}$ that are provided through the collectors of a transistor 132 and a transistor 134, respectively, of the differential output circuit. The differential output current is proportional to or related to the current flowing through bandpass capacitor 20. As a result of providing the differential output current that is related to or proportional to the current flowing through bandpass capacitor 20, a boost term is added to the numerator of the transfer function of continuous-time filter 10. Furthermore, the amplitude of the differential output current is programmable which is results in a programmable boost term.

In addition to the differential input circuit and the differential output circuit, capacitor current sensing circuitry 100 further includes a fixed current source 130, a diode 128, a diode 136, a variable current source 120, a variable current source 122, an error amplifier 118, an input current sink 126, and a programmable output current sink 138. The differential input circuit includes transistor 123 and transistor 124 which are implemented, in the one embodiment of FIG. 2, as npn bipolar junction transistors. Transistor 123 and transistor 124 receive the sense voltage $V_S$ between the base terminals of each of these transistors and generate corresponding input currents as a result. A first input current will flow through transistor 123 and a second input current will flow through transistor 124 that is related or proportional to the current flowing through bandpass capacitor 20 which is related to the currents flowing through FET 112 and FET 114. The sum of the first input current and the second input current is equivalent to the current provided to input current sink 126. Input current sink 126 may be provided as a programmable current sink that is used to help establish the bandwidth or cut-off frequency of continuous-time filter 10 by tracking the current through current sink 116.

The first input current and the second input current each include a first component and a second component. The first current component of the first input current is provided through diode 128 from fixed current source 130 to the collector of transistor 123. The first component of the second input current is provided through diode 136 from fixed current source 130 to the collector of transistor 124. Although the currents provided through diode 128 and diode 136 will generally be different and varying with the sense voltage $V_S$, the current provided by fixed current source 130 will be provided at a predefined value that is fixed and constant.

The second component of each of the input currents is provided at the same or nearly the same current values. The level or value of the second component is determined by variable current source 120 and variable current source 122 as controlled by error amplifier 118. The second component of the first input current is provided to the collector of transistor 123 by variable current source 120. The second component of the second input current is provided to the collector of transistor 124 by variable current source 122. Variable current source 120 and variable current source 122 are controlled by error amplifier 118 which establishes the output currents of each of these variable current sources at the same value or about the same value. Once again, the currents provided by variable current source 120 and variable current source 122 will be provided at the same or nearly the same values and will serve as the second component of the first input current and the second input current. Thus, since the second component of the first input current and the second input current is provided at the same or nearly the same value, the first component of the first input current and the second input current will generally be different and will reflect the signal component of interest that is related to the current flowing through bandpass capacitor 20.

Error amplifier 118 is a differential amplifier that receives a reference ("REF") voltage at an inverting terminal and a status voltage at a non-inverting terminal. The output of error amplifier 118 controls variable current source 120 and variable current source 122. Whenever the status voltage, which is provided from an output node of fixed current source 130, is greater than the REF voltage, more current is provided from variable current source 120 and variable current source 122. Conversely, whenever the status voltage is less than the REF voltage, less current is provided from variable current source 120 and variable current source 122. Variable current source 120 and variable current source 122 may be implemented using current mirrors configured using field effect transistors, such as p-channel MOSFETS. The reference voltage may be generated using any method such as by providing a fixed current through a resistor coupled to source voltage $V_{CC}$.

As a consequence of the first input current flowing through transistor 123 and the second input current flowing through transistor 124, the collector voltages of transistor 123 and transistor 124 will generate a first input voltage and a second input voltage, respectively, that correspond to the currents flowing through diode 128 and diode 136. The first input voltage is provided to the base of transistor 132, and the second input voltage is provided to the base of transistor 134. Transistor 132 and transistor 134 may be referred to as a differential output circuit. These input voltages control the generation of the differential output current, $I_{OP}$ and $I_{OM}$.

Output current $I_{OP}$ is generated through transistor 132 as a result of receiving the first input voltage at the base of transistor 132. Similarly, output current $I_{OM}$ is generated through transistor 134 as a result of receiving the second input voltage at the base of transistor 134. The sum of output current $I_{OP}$ and output current $I_{OM}$ will be equivalent to the current received by programmable current sink 138. Programmable current sink 138 may be programmed to any desired level and will serve as the programmable boost of continuous-time filter 10. As is shown and illustrated, programmable output current sink 138 is not dependent on the value of $I_{T1}$ that is provided through input current sink 126 or current sink 116 and hence the boost is independent of the bandwidth. The amplification or boost of the first input current and the second input current to generate the output currents $I_{OP}$ and $I_{OM}$ is controlled by the ratio of programmable output current sink 138 and input current sink 126. It should be noted that the differential output current is generated without having to amplify or mirror the current $I_{T1}$ which substantially reduces overall power consumption and circuitry area.

It should be understood that although the one embodiment of capacitor current sensing circuitry 100, as illustrated in FIG. 2, has been shown and discussed as including various circuitry and transistor technologies, other embodiments of the present invention may be implemented using different circuitry or different circuitry configurations, while still providing the functions falling within the scope of the present invention. For example, different types of bipolar junction transistors, such as npn and pnp transistors, may be implemented to practice the current invention. Therefore, it should be understood that the present invention encompasses all such embodiments of the present invention.

The implementation and illustration of capacitor current sensing circuitry 100 may be the same as or similar to capacitor current sensing circuitry 102 of continuous-time filter 10 as shown in FIG. 1. Thus, the illustration and description of capacitor current sensing circuitry 100 may apply also to capacitor current sensing circuitry 102. Capacitor current sensing circuitry 102 receives a sense voltage V. from first biquad stage 80 that corresponds to the current being provided through low pass capacitor 22 and generates a corresponding output current in response. The output current provided from capacitor current sensing circuitry 102 corresponds or is proportional to the first derivative of the input voltage provided from first biquad stage 80 to second biquad stage 82. As a consequence, the output current of capacitor current sensing circuitry 102 serves as an asymmetric zero or constant group delay term. Because the output current of capacitor current sensing circuitry 102 is programmable, capacitor current sensing circuitry 102 provides a programmable group delay. The output current, which will generally be a differential output current, is then provided to the output of transconductor 24 and bandpass capacitor 32 of second biquad stage 82 SO that the programmable group delay may be provided to continuous-time filter 10. The programmable group delay may be provided independent of the bandwidth of continuous-time filter 10. Thus, the illustration and description of capacitor current sensing circuitry 100 applies equally to capacitor current sensing circuitry 102.

Thus, it is apparent that there has been provided, in accordance with the present invention, a circuitry and method for providing boost and asymmetry in a continuous-time filter that satisfy the advantages set forth above. Although the preferred embodiment has been described in detail, it should be understood that various changes, substitutions, and alterations can be made herein without departing from the scope of the present invention. For example, although implementations and embodiments of the present invention have been illustrated using both bipolar junction transistor and field effect transistor technology, the present invention is not limited to any one transistor technology, type, or combination. For example, FET 112 and FET 114, which are illustrated in FIG. 2 as n-channel FET's, could also be provided as p-channel FETs in other embodiments of the present invention. Also, the circuitry described and illustrated in the preferred embodiment as discrete or separate circuits may be combined into one circuit or split into separate circuits without departing from the scope of the present invention. Furthermore, the direct connections illustrated herein could be altered by one skilled in the art such that two devices are merely coupled to one another through an intermediate device or devices, without being directly connected, while still achieving the desired results demonstrated by the present invention. Other examples of changes, substitutions, and alterations are readily ascertainable by one skilled in the art and could be made without departing from the spirit and scope of the present invention as defined by the following claims.

What is claimed is:

1. A capacitor current sensing circuitry for sensing a current through a capacitor of a filter stage and generating a corresponding differential output current in response, the capacitor current sensing circuitry comprising:

a differential input circuit operable to receive an input sense voltage that is related to the current flowing through the capacitor and to generate a first input current and a second input current, the differential input circuit further operable to generate a first input voltage related to the first input current and a second input voltage related to the second input current;

wherein the differential input circuit includes a current source operable to provide a first current component of the first input current and a first current component of the second input current;

a first variable input current source operable to receive a control signalband to generate a second current component of the first input current in response;

a second variable input current source operable to receive the control signal and to generate a second current component of the second input current in response;

an input current sink operable to receive the first input current and the second input current;

a differential output circuit operable to receive the first input voltage and the second input voltage and to generate a first output current and a second output current in response; and an output current sink operable to receive the first output current and the second output current.

2. The capacitor current sensing circuitry of claim 1, wherein the second current component of the first input current and the second current component of the second input current are about equivalent.

3. The capacitor current sensing circuitry of claim 1, wherein the current source includes a first input transistor and a second input transistor, and wherein the first input current flows through the first input transistor and the second input current flows through the second input transistor.

4. The capacitor current sensing circuitry of claim 1, wherein the output current sink is a programmable current sink.

5. The capacitor current sensing circuitry of claim 1, wherein the input current sink is a programmable current sink.

6. The capacitor current sensing circuitry of claim 1, wherein the current source is a fixed current source.

7. The capacitor current sensing circuitry of claim 1, wherein the output current sink and the input current sink are independent.

8. The capacitor current sensing circuitry of claim 1, wherein the differential output circuit includes a first output transistor and a second output transistor, and wherein the first output current flows through the first output transistor and the second output current flows through the second output transistor.

9. A capacitor current sensing circuitry for sensing a current through a capacitor of a filter stage and generating a corresponding differential output current in response, the capacitor current sensing circuitry comprising:

a differential input circuit operable to receive an input sense voltage that is related to the current flowing through the capacitor and to generate a first input current and a second input current, the differential input circuit further operable to generate a first input voltage related to the first input current and a second input voltage related to the second input current;

wherein the differential input circuit includes a current source operable to provide a first current component of the first input current and a first current component of the second input current;

a first variable input current source operable to receive a control signal and to generate a second current component of the first input current in response;

a second variable input current source operable to receive the control signal and to generate a second current component of the second input current in response;

an input current sink operable to receive the first input current and the second input current;

a differential output circuit operable to receive the first input voltage and the second input voltage and to generate a first output current and a second output current in response; and an output current sink operable to receive the first output current and the second output current, wherein the second current component of the first input current and the second current component of the second input current are about equivalent;

further comprising an error amplifier operable to generate the control signal in response to receiving a status voltage and a reference voltage.

10. A capacitor current sensing circuitry for sensing a current through a capacitor of a filter stage and generating a corresponding differential output current in response, the capacitor current sensing circuitry comprising:

a differential input circuit operable to receive an input sense voltage that is related to the current flowing through the capacitor and to generate a first input current and a second input current, the differential input circuit further operable to generate a first input voltage related to the first input current and a second input voltage related to the second input current;

wherein the differential input circuit includes a current source operable to provide a first current component of the first input current and a first current component of the second input current;

a first variable input current source operable to receive a control signal and to generate a second current component of the first input current in response;

a second variable input current source operable to receive the control signal and to generate a second current component of the second input current in response;

an input current sink operable to receive the first input current and the second input current;

a differential output circuit operable to receive the first input voltage and the second input voltage and to generate a first output current and a second output current in response; and an output current sink operable to receive the first output current and the second output current, further comprising a first diode coupled between the current source and the differential input circuit for providing the first current component of the first input current, and a second diode coupled between the current source and the differential input circuit for providing the first current component of the second input current.

11. The capacitor current sensing circuitry of claim 10, wherein each of the diodes is implemented using a bipolar junction transistor.

* * * * *